(12) United States Patent
Morin et al.

(10) Patent No.: US 11,064,242 B2
(45) Date of Patent: Jul. 13, 2021

(54) ON-SCREEN ITEM GRID CONTROL METHOD AND DEVICE, AND CORRESPONDING DISPLAY DEVICE AND ANCILLARY DEVICE

(71) Applicant: InterDigital CE Patent Holdings, Paris (FR)

(72) Inventors: Thomas Morin, Rennes (FR); Karine Jegou, Chateaugiron (FR); Christophe Jollivet, Vern sur Seiche (FR)

(73) Assignee: INTERDIGITAL CE PATENT HOLDINGS, Paris (FR)

( * ) Notice: Subject to any disclaimer, the term of this patent is extended or adjusted under 35 U.S.C. 154(b) by 161 days.

(21) Appl. No.: 16/525,703

(22) Filed: Jul. 30, 2019

(65) Prior Publication Data

US 2020/0050334 A1 Feb. 13, 2020

(30) Foreign Application Priority Data

Aug. 8, 2018 (EP) .................................. 18306090

(51) Int. Cl.
*H04N 21/422* (2011.01)
*G06F 3/0482* (2013.01)
*G06F 3/0487* (2013.01)

(52) U.S. Cl.
CPC ..... *H04N 21/42215* (2013.01); *G06F 3/0482* (2013.01); *G06F 3/0487* (2013.01); *H04N 21/42204* (2013.01); *H03J 2200/22* (2013.01); *H04N 21/42216* (2013.01)

(58) Field of Classification Search
CPC ....... H04N 21/42215; H04N 21/42204; H04N 21/42216; G06F 3/0482; H03J 2200/22
USPC ....................................................... 345/159
See application file for complete search history.

(56) References Cited

U.S. PATENT DOCUMENTS

| | | | |
|---|---|---|---|
| 4,313,113 A * | 1/1982 | Thornburg | B41J 5/28 341/34 |
| 2004/0218104 A1* | 11/2004 | Smith | G06F 3/017 348/734 |
| 2010/0177042 A1* | 7/2010 | Chen | G06F 3/03547 345/159 |
| 2011/0055865 A1* | 3/2011 | Jung | H04N 21/4852 725/38 |
| 2015/0062444 A1* | 3/2015 | Henty | H04N 21/42222 348/734 |
| 2015/0301622 A1* | 10/2015 | Chen | G06F 3/038 345/159 |
| 2016/0070361 A1 | 3/2016 | Parker et al. | |
| 2016/0105627 A1* | 4/2016 | Streuter | H04N 21/4221 348/734 |
| 2018/0024647 A1 | 1/2018 | Coletrane-Pagan et al. | |

\* cited by examiner

*Primary Examiner* — Albert K Wong
(74) *Attorney, Agent, or Firm* — Patricia A. Verlangieri

(57) ABSTRACT

A method and device for moving an indicator on an on-screen keyboard depicted on a display device is described. A series of signals transmitted from a remote-control unit are received at the display device. The indicator on a grid depicted on the display device is moved based on the received signals. A time for moving the indicator on the grid varies based on the series of signals received from the remote-control unit.

20 Claims, 4 Drawing Sheets

ON-SCREEN ITEM GRID CONTROL METHOD AND DEVICE, AND CORRESPONDING DISPLAY DEVICE AND ANCILLARY DEVICE

REFERENCE TO RELATED EUROPEAN APPLICATION

This application claims priority from European Patent Application No. 18306090.4, entitled "ON-SCREEN ITEM GRID CONTROL METHOD AND DEVICE, AND CORRESPONDING DISPLAY DEVICE AND ANCILLARY DEVICE", filed on Aug. 8, 2018, the contents of which are hereby incorporated by reference in its entirety.

FIELD

The disclosure generally relates to an on-screen keyboard (OSK) depicted on a display device.

BACKGROUND

It is sometimes tedious using a remote-control unit (e.g. IR (Infrared) or BLE (Bluetooth Low Energy)) to manipulate an on-screen keyboard displayed on a display device (e.g. on a TV screen). On standard systems, when the user presses and holds a directional key (e.g. up, down, left or right) of the remote-control unit, the action generally starts about one second after. In other words, a key-repeat feature is triggered after an initial delay of one second. When triggered, the key-repeat feature has a constant key-repeat rate (also referred to as "key-repeat speed") which is very fast. The constant key-repeat rate is defined as the inverse of a time interval between two successive positions of an indicator on the on-screen keyboard. Such a native key-repeat mechanism is mainly designed to quickly reach a border of the on-screen keyboard.

Moreover, the initial key-repeat delay and the constant key-repeat rate have predetermined values that may not suit all systems because processing may add time, and it may not suit all users. Someone may find the system too quick to aim at a character, or key-repeat-triggering too sensitive, e.g., a "heavy finger" user may move the indicator (focus) twice instead of once.

Therefore, a need exists to improve the ergonomics of the system including the remote-control unit and the on-screen keyboard, in terms of performance (speed and accuracy), feeling and learning.

SUMMARY

The proposed method and apparatus concern indicator movements on an on-screen keyboard depicted on a display device. It will be appreciated that the method and apparatus is not limited to any specific type of system and may also be applied to on-screen grids, such as for example on-screen menus, on-screen lists, etc.

According to a first aspect of the disclosure, a method is disclosed for receiving at a display device a series of signals transmitted from a remote-control unit. An indicator on a grid depicted on the display device is moved based on the received signals. A reaction time for moving the indicator on the grid varies based on the series of signals received from the remote-control unit.

In an embodiment, the grid includes at least one row and a plurality of columns or plurality of rows and at least one column.

In an embodiment, the reaction time for moving the indicator is based on the inverse of the time interval for moving the indicator between two consecutive positions on the grid.

In an embodiment, the reaction time for moving the indicator is a first time, if the number of indicator moves is lower or equal to a first number of indicator moves and the reaction time for moving the indicator is a second time, less than the first time, if the number of indicator moves is greater than the first number of indicator moves.

In an embodiment, the reaction time for moving the indicator on the grid is further analyzed and modified based on such analysis.

In an embodiment, the reaction time for moving the indicator is analyzed when the indicator is moved at least N successive positions in a first direction, with N≥2, followed by M successive positions in a second direction opposite to said first direction, with M≥1.

In an embodiment, the reaction time is modified if at least P=2 analyses are performed during a time period D1.

In an embodiment, the reaction time for moving the indicator on the grid is decreased, if 2≤P≤4 analyses are performed during a time period 10 s≤D1≤30 s.

In an embodiment, the reaction time for moving the indicator on the grid is increased, if P=0 analyses are performed during a time period 40 s≤D1≤120 s.

In an embodiment, the grid is one of an on-screen keyboard, an on-screen menu and an on-screen list.

According to a second aspect of the disclosure, a device is provided having a receiver configured to receive a series of signals transmitted from a remote-control unit and a processor configured to move an indicator on a grid depicted on a display device based on the received signals. A reaction time for moving the indicator on the grid varies based on the series of signals received from the remote-control unit.

In an embodiment, the grid includes at least one row and a plurality of columns or a plurality of rows and at least one column.

In an embodiment, the reaction time for moving the indicator is based on the inverse of the time interval for moving the indicator between two consecutive positions on the grid.

In an embodiment, the reaction time for moving the indicator is a first time, if the number of indicator moves is lower or equal to a first number of indicator moves and the reaction time for moving the indicator is a second time, less than the first time, if the number of indicator moves is greater than the first number of indicator moves.

In an embodiment, the reaction time for moving the indicator on the grid is further analyzed and modified based on such analysis.

In an embodiment, the reaction time for moving the indicator is analyzed when the indicator is moved at least N successive positions in a first direction, with N≥2, followed by M successive positions in a second direction opposite to said first direction, with M≥1.

In an embodiment, the reaction time is modified if at least P=2 analyses are performed during a time period D1.

In an embodiment, the reaction time for moving the indicator on the grid is decreased, if 2≤P≤4 analyses are performed during a time period 10 s≤D1≤30 s.

In an embodiment, the reaction time for moving the indicator on the grid is increased, if P=0 analyses are performed during a time period 40 s≤D1≤120 s.

In an embodiment, the grid is one of an on-screen keyboard, an on-screen menu and an on-screen list.

In an embodiment, a system is provided including a remote-control unit and a device having a receiver configured to receive a series of signals transmitted from a remote-control unit and a processor configured to move an indicator on a grid depicted on a display device based on the received signals. A reaction time for moving the indicator on the grid varies based on the series of signals received from the remote-control unit.

At least parts of some processes implemented by elements of the disclosure may be computer implemented. Accordingly, such elements may take the form of an entirely hardware embodiment, an entirely software embodiment (including firmware, resident software, microcode, etc.) or an embodiment combining software and hardware aspects that may all generally be referred to herein as "circuit", "module" or "system". Furthermore, such elements may take the form of a computer program product embodied in any tangible medium of expression having computer usable program code embodied in the medium.

Since elements of the present disclosure can be implemented in software, the present disclosure can be embodied as computer readable code for provision to a programmable apparatus on any suitable carrier medium. A tangible carrier medium may comprise a storage medium such as a floppy disk, a CD-ROM, a hard disk drive, a magnetic tape device or a solid-state memory device and the like. A transient carrier medium may include a signal such as an electrical signal, an optical signal, an acoustic signal, a magnetic signal or an electromagnetic signal, e.g., a microwave or RF signal.

LIST OF FIGURES

Other features and advantages of embodiments shall appear from the following description, given by way of indicative and non-exhaustive examples and from the appended drawings, of which:

DETAILED DESCRIPTION

The disclosure relates to a method (and corresponding device) for controlling the movements of an indicator (also referred to as "focus") or a positional indicator on an on-screen grid based on directional signals transmitted from a remote-control unit (or RCU) comprising directional keys (usually "UP", "RIGHT", "DOWN" and "LEFT" keys of a D-pad (Directional pad)). The positional indicator may be for example, a cursor.

The disclosure can be applied particularly but not exclusively with a particular type of on-screen grid which is an on-screen keyboard (OSK) depicted on a display device (e.g. a TV) and that can be used instead of a physical keyboard. The on-screen keyboard is for example an alphanumeric on-screen keyboard (of any type: AZERTY, QWERTY, etc.). In alternative embodiments, it can be applied with any type of on-screen keyboard (broadly defined as a layout comprising keys, also referred to a as buttons, arranged essentially in rows and/or columns): lists, menus, etc.

The disclosure can also be applied with other types of on-screen grids, such as for example on-screen menus, on-screen lists, etc.

In all of the figures of the disclosure, similar elements and steps are designated by the same numerical reference sign.

Figure 1:
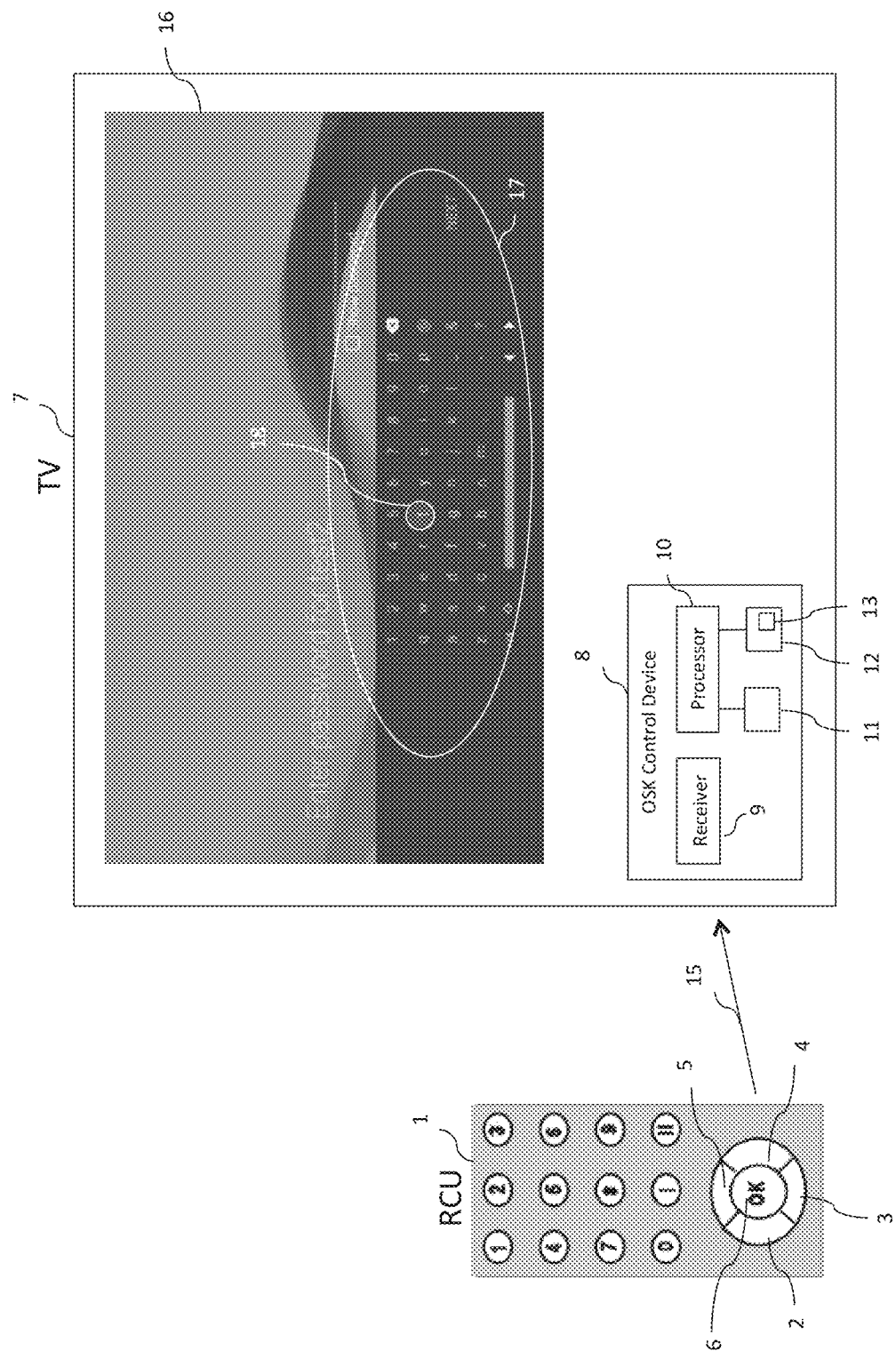
FIG. 1 illustrates an example in which a particular embodiment of an on-screen grid control device is in a television.

Referring now to FIG. 1, there is shown an exemplary embodiment of an on-screen grid which is an on-screen keyboard control device (OSK control device) 8 internal to a TV 7. In a variant of FIG. 1, shown in FIG. 2, the OSK control device 8 is external to the TV 7.

As already mentioned above, the disclosure applies also with any other type of on-screen grid (such as, for example, an on-screen menu, an on-screen list, etc.) including either at least one row and several columns or several rows and at least one column.

The system may also include a remote-control unit (RCU) 1 having directional keys (in this embodiment, UP key 5, RIGHT key 4, DOWN key 3 and LEFT key 2 of a D-pad) and an OK key 6. Based on activation of one or more of the directional keys 2-5, the remote-control unit 1 transmits directional signals 15 to the OSK control device 8. Alternatively, a keyboard device (not shown) with directional keys may be used to control the movement of the indicator on the on-screen grid.

An exemplary on-screen keyboard 17 is depicted on screen 16 of the TV 7. In the illustrated embodiment, the on-screen keyboard 17 is of the QWERTY type.

In the illustrated embodiment, the OSK control device 8 comprises a receiver 9 configured to receive the signals transmitted by the remote-control unit 1, in particular signals 15.

The OSK control device 8 also includes a non-volatile memory 12 (e.g., a read-only memory (ROM) or a hard disk), a volatile memory 11 (e.g. a random-access memory or RAM) and a processor (reprogrammable computation machine) 10. The non-volatile memory 12 is a non-transitory computer-readable carrier medium. It stores executable program code instructions 13, which are executed by the processor 10 in order to enable implementation of the method described below (discussed with reference to FIGS. 3 and 4). Upon initialization, the program code instructions 13 are transferred from the non-volatile memory 12 to the volatile memory 11 so as to be executed by the processor 10. The volatile memory 11 likewise includes registers for storing the variables and parameters required for this execution.

All the steps of the method described below (discussed with reference to FIGS. 3 and 4) can be implemented by the OSK control device 8, by the execution of a set of program code instructions executed by a reprogrammable computing machine such as the processor 10 or a microcontroller, or by a dedicated computing machine or component, such as a FPGA (Field Programmable Gate Array), an ASIC (Application-Specific Integrated Circuit) or any dedicated hardware component.

In other words, the disclosure is not limited to the purely software-based implementation of FIG. 1, in the form of computer program instructions, but that it can also be implemented in hardware form or any form combining a hardware portion and a software portion.

The OSK control device 8 (and more precisely the processor 10 when executing the program code instructions 13) is configured for:

receiving the signals 15 for moving the indicator on the on-screen keyboard 17 (via the receiver 9);

moving a indicator 18 (also referred to as "focus") on the on-screen keyboard 17 based on the received signals 15 (in the example shown in FIG. 1, the indicator 18 is positioned on the letter "t"); and when receiving at least one signal indicating that one of the directional keys 2-5 is activated, triggering a reaction time for moving the indicator. In other word, the reaction time for moving the indicator is a key-repeat feature after an initial key-repeat delay (hereinafter referred to as "KEY_REPEAT_DELAY_FIRST").

The reaction time for moving the indicator has a key-repeat rate defined as the inverse of a delay between two successive positions of the indicator on the on-screen keyboard 17. For example, with a delay of 200 ms between two successive positions of the indicator, the key-repeat rate is: R=1/(200 ms)=5 repeats per second.

According to one embodiment, the reaction time for moving the indicator is variable and takes at least two different values based at least on a number of jumps between successive positions of the indicator after triggering an initial key-repeat feature.

In a particular embodiment, the reaction time may have a first value if the number of jump is lower than a first number of indicator moves, and a second value, lower than the first value, if the number of jumps is greater than or equal to the first number of indicator moves.

In a particular embodiment, the second value of the reaction time is greater than the inverse of the initial key-repeat delay.

In a particular embodiment, the reaction time may have a third value, lower than the second value, if the indicator has reached a current position that is an edge of the on-screen keyboard and if a jump function between opposite edges of the on-screen keyboard is implemented.

Other characteristics of the key-repeat feature according to the disclosure are presented below, with a detailed description of first and second algorithms carried out by the OSK control device 8.

Figure 2:
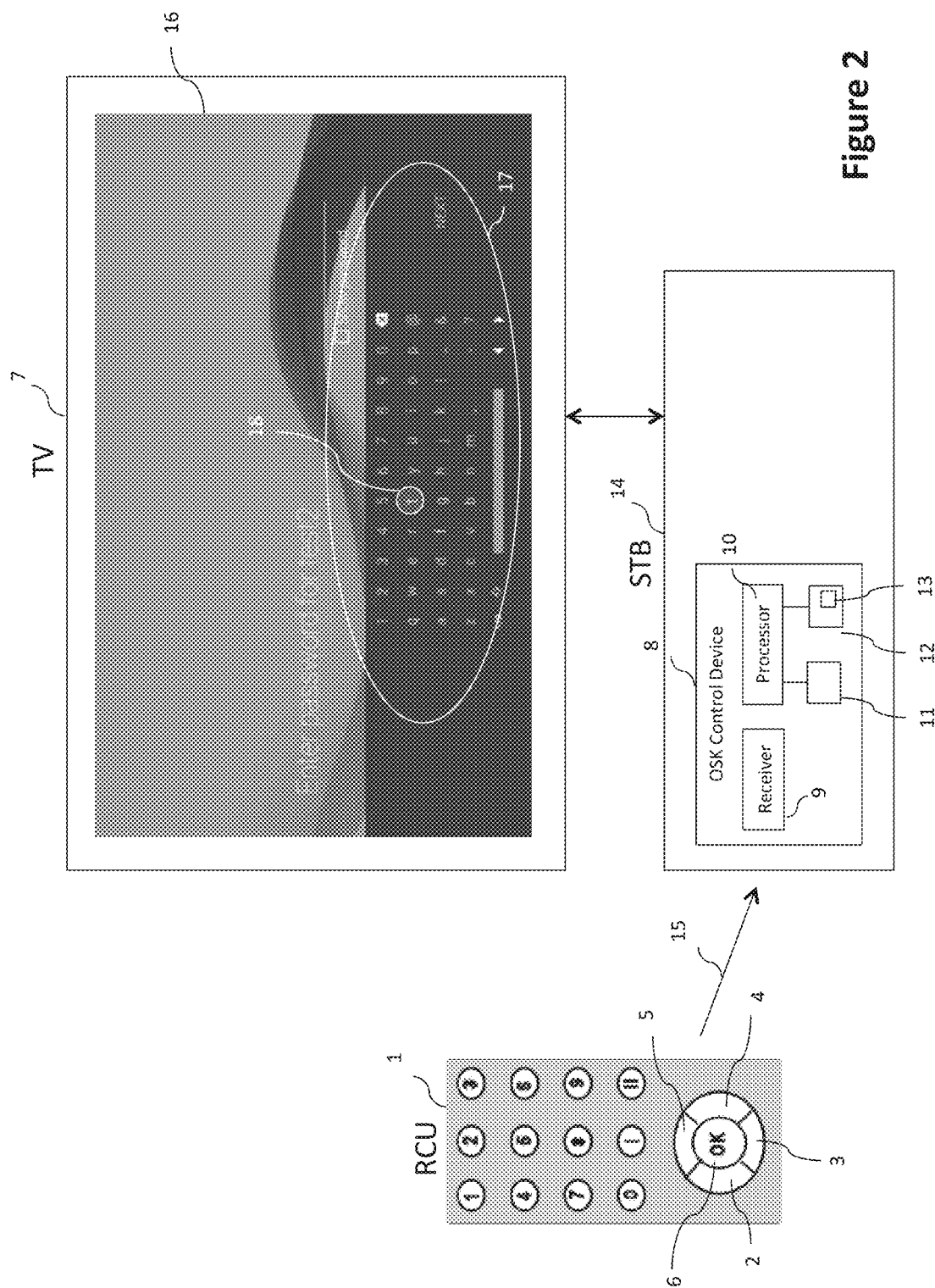
FIG. 2 illustrates another example in which a particular embodiment of an on-screen grid control device is in an ancillary device (e.g. a Set-Top-Box)

FIG. 2 illustrates a second exemplary embodiment in which the on-screen grid is an OSK control device 8 (e.g. as defined above in relation to FIG. 1) in an ancillary device 14 which is external to the TV 7. The ancillary device 14 may be for example a set-top-box, a BlueRay player, a game console, etc. In a variant of FIG. 2, the OSK control device 8 may also be external to the ancillary device 14.

Figure 3:
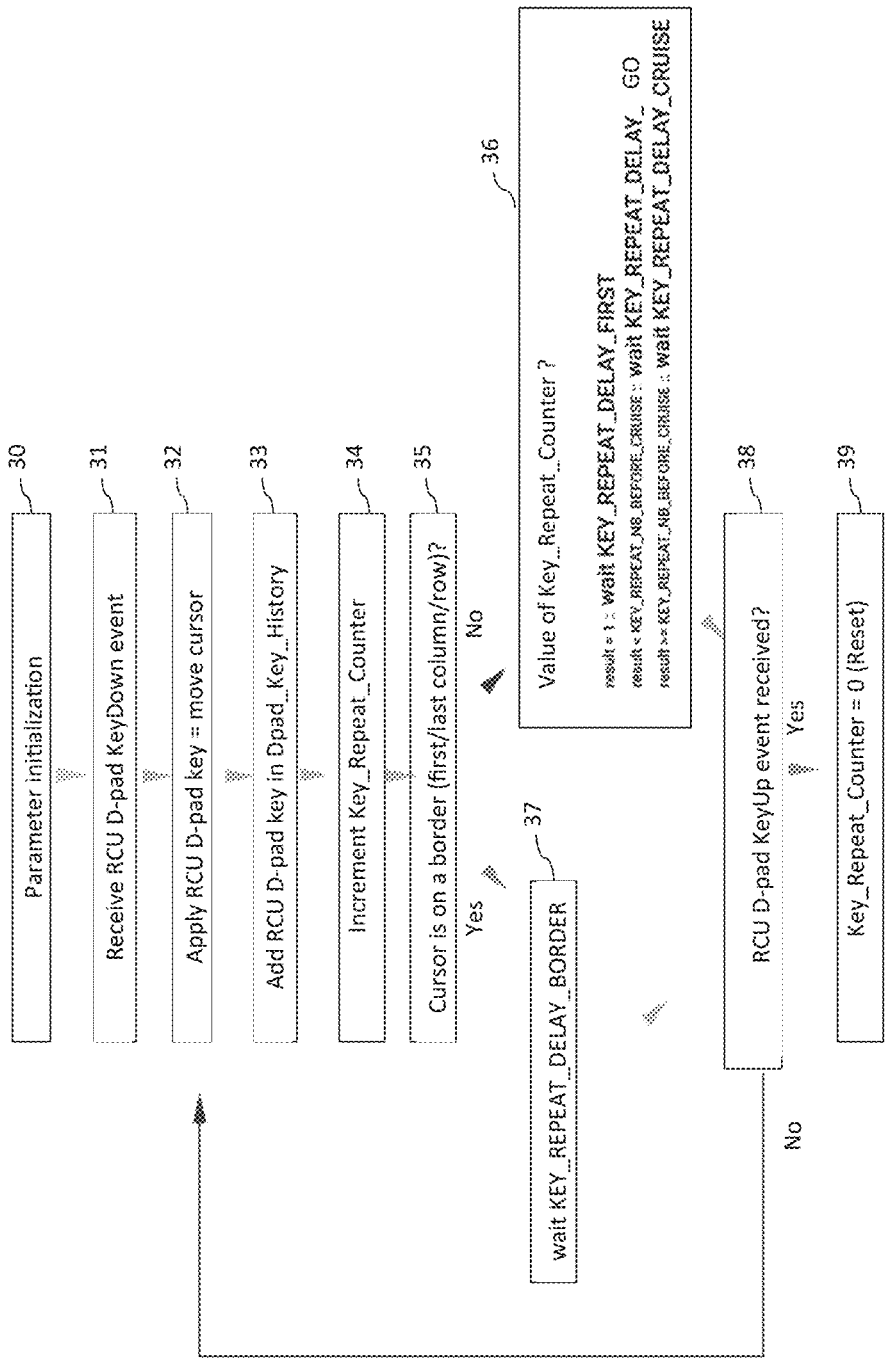
FIG. 3 is a flowchart of an exemplary algorithm executed by the on-screen grid control device of FIG. 1 or 2.

FIG. 3 is a flowchart of a first algorithm (also referred to as "smart key-repeat algorithm") carried out by the OSK control device 8 of FIG. 1 or 2.

In order to implement the first algorithm according to a particular embodiment, we introduce four key-repeat time-intervals, e.g., reaction times for moving the indicator (in a variant, the last one is not used):

KEY_REPEAT_DELAY_FIRST is applied before triggering the key-repeat feature, after a press (KeyDown event) on one of the directional keys (also referred to as "D-pad key") 2-5 (and therefore also after a first indicator movement is performed).

KEY_REPEAT_DELAY_GO is linked to another parameter: KEY_REPEAT_NB_BEFORE_CRUISE. Generally, the user doesn't use the long press of one of the D-pad keys 2-5 to focus close characters. For example, on a QWERTY on-screen keyboard (as shown in FIGS. 1 and 2), if the indicator is on the "Q", the user will press the RIGHT key 4 twice to move (focus) the indicator to the "E". In the disclosure, if the key-repeat feature is started (i.e. if KEY_REPEAT_DELAY_FIRST has elapsed and the user still presses one of the D-pad keys 2-5), the indicator can move faster on the close characters.

KEY_REPEAT_DELAY_CRUISE is applied when the indicator has moved far enough from the origin (according to KEY_REPEAT_NB_BEFORE_CRUISE).

KEY_REPEAT_DELAY_BORDER is only used if the system allows the indicator the indicator to be moved from one border to another (i.e. cycling focus on rows/columns: e.g. LEFT key 2 when the indicator is on the first column focuses the last character on the right; on a QWERTY keyboard, LEFT key 2 on the "Q" leads the indicator to the "P". On a long D-pad key press, ergonomics is improved if the indicator is slowed down on the borders.

Each of the last three key-repeat time-intervals (KEY_REPEAT_DELAY_GO, KEY_REPEAT_DELAY_CRUISE and KEY_REPEAT_DELAY_BORDER) can be seen as a delay (time interval) between two successive positions of the indicator 18 on the OSK 17. Therefore, the inverse of each of these last three key-repeat time-intervals is a different possible value of the variable key-repeat rate (reaction time for moving the indicator).

In one embodiment, the values used for the different parameters defined above are as follows:

KEY_REPEAT_NB_BEFORE_CRUISE=3;

KEY_REPEAT_DELAY_FIRST=200 ms;

KEY_REPEAT_DELAY_GO=80 ms (and therefore a first value of the variable key-repeat rate: V1=1/(80 ms));

KEY_REPEAT_DELAY_CRUISE=120 ms (and therefore a second value of the variable key-repeat rate: V2=1/(120 ms), which is lower than the first value V1 and greater than the inverse of KEY_REPEAT_DELAY_FIRST);

KEY_REPEAT_DELAY_BORDER=270 ms (and therefore a third value of the variable key-repeat rate: V3=1/(270 ms), which is lower than the second value V2).

With such values, if the user activates the D-pad RIGHT key 4 to go from the "Q" to the "U" on the QWERTY on-screen keyboard 17, it takes:

720 ms if the OSK control device performs a wait before each movement of the indicator (the sequence is as follows: wait of 200 ms, movement from Q to W, wait of 80 ms, movement from W to E, wait of 80 ms, movement from E to R, wait of 120 ms, movement from R to T, wait of 120 ms, movement from T to Y, wait of 120 ms and movement from Y to U); or 600 ms if the OSK control device performs a wait after each movement of the indicator (the sequence is as follows: movement from Q to W, wait of 200 ms, movement from W to E, wait of 80 ms, movement from E to R, wait of 80 ms, movement from R to T, wait of 120 ms, movement from T to Y, wait of 120 ms and movement from Y to U).

Of course, other values can be used for the aforesaid different parameters. The accuracy gets better with longer delays. However, the system feels more reactive with small values, and it's often faster to roughly reach a keyboard zone and fine-tune the focus position, rather than slowing down the system to get absolutely no fine-tuning. So, it's a compromise between speed and pure accuracy. This will be considered in the second algorithm, which is detailed below with respect to FIG. 4 and enables a customization of such values.

We now detail the different steps of the first algorithm shown in FIG. 3.

In step 30, a parameter initialization is performed as follows:
Key_Repeat_Counter=0
D-pad_Key_History=[ ] (empty)

In step 31, the OSK control device receives a signal indicating a press (KeyDown event) on one of the D-pad keys 2-5 of the remote-control unit (RCU).

In step 32, the OSK control device applies a movement associated with the pressed D-pad key, i.e. moves the indicator on the on-screen keyboard, from one position to the next (i.e. a jump between two successive positions) according to the pressed D-pad key (e.g. the OSK control device applies a jump of the indicator from the "Q" to the "W" on the on-screen keyboard 17, in case of a press on the D-pad RIGHT key 4).

In step 33, the OSK control device records the indicator movement of step 32, by completing a history variable, named "D-pad_Key_History" (used in the second algorithm of FIG. 4), i.e. by adding to this history variable the movement carried out in step 32 and associated with the pressed D-pad key. For example, in case of a press on the D-pad RIGHT key 4, the movement "RIGHT" is added to the history variable.

In step 34, the OSK control device increments by one a key-repeat counter (named "Key_Repeat_Counter"), which is used to count the number of indicator jumps between successive keyboard positions.

In step 35, the OSK control device detects if the indicator is on a border (first/last column/row) of the on-screen keyboard 17.

In the case of a negative answer in step 35, the algorithm continues in step 36, in which the OSK control device performs a wait step, whose duration depends on the value of "Key_Repeat_Counter":
if Key_Repeat_Counter=1, the duration of the wait step is KEY_REPEAT_DELAY_FIRST;
if Key_Repeat_Counter≤KEY_REPEAT_NB_ BEFORE_CRUISE, the duration of the wait step is KEY_REPEAT_DELAY_GO;
if Key_Repeat_Counter>KEY_REPEAT_NB_ BEFORE_CRUISE, the duration of the wait step is KEY_REPEAT_DELAY_CRUISE.

In an alternative embodiment of step 36, if Key_Repeat_Counter≤KEY_REPEAT_NB_BEFORE_CRUISE, the duration of the wait step (i.e. KEY_REPEAT_DELAY_GO) is variable and takes a different value for each value of Key_Repeat_Counter greater than "1" and lower or equal to KEY_REPEAT_NB_BEFORE_CRUISE.

For example, with KEY_REPEAT_NB_ BEFORE_CRUISE=3:
KEY_REPEAT_DELAY_GO=⅓*KEY_REPEAT_ NB_DELAY_CRUISE=⅓*120=40 ms, if Key_Repeat_Counter=2; and
KEY_REPEAT_DELAY_GO=⅔*KEY_REPEAT_ NB_DELAY_CRUISE=⅔*120=80 ms, if Key_Repeat_Counter=3.

In the case of a positive answer in step 35, the algorithm continues in step 37, in which the OSK control device performs a wait step whose duration is KEY_REPEAT_DELAY_BORDER.

After step 36 or 37, the algorithm continues in step 38, in which the OSK control device detects if it has received a directional signal indicating a release (KeyUp event) of the D-pad key which was indicated as pressed in step 31.

In the case of a negative answer in step 38, the algorithm goes back to step 32 (the key-repeat feature is still active since the user has not yet released the D-pad key.

In the case of a positive answer in step 38, the algorithm continues in final step 39 in which the OSK control device resets "Key_Repeat_Counter" to zero (end of the key-repeat feature).

In the embodiment of FIG. 3, the OSK control device performs a wait step (step 36 or 37) after each movement of the indicator (step 32).

In an alternative embodiment, step 32 is carried out after steps 36 and 37 and before step 38, and in the case of a negative answer in step 38, the algorithm goes back to step 33. Thus, the OSK control device performs a wait step (step 36 or 37) before each movement of the indicator (step 32).

Figure 4:
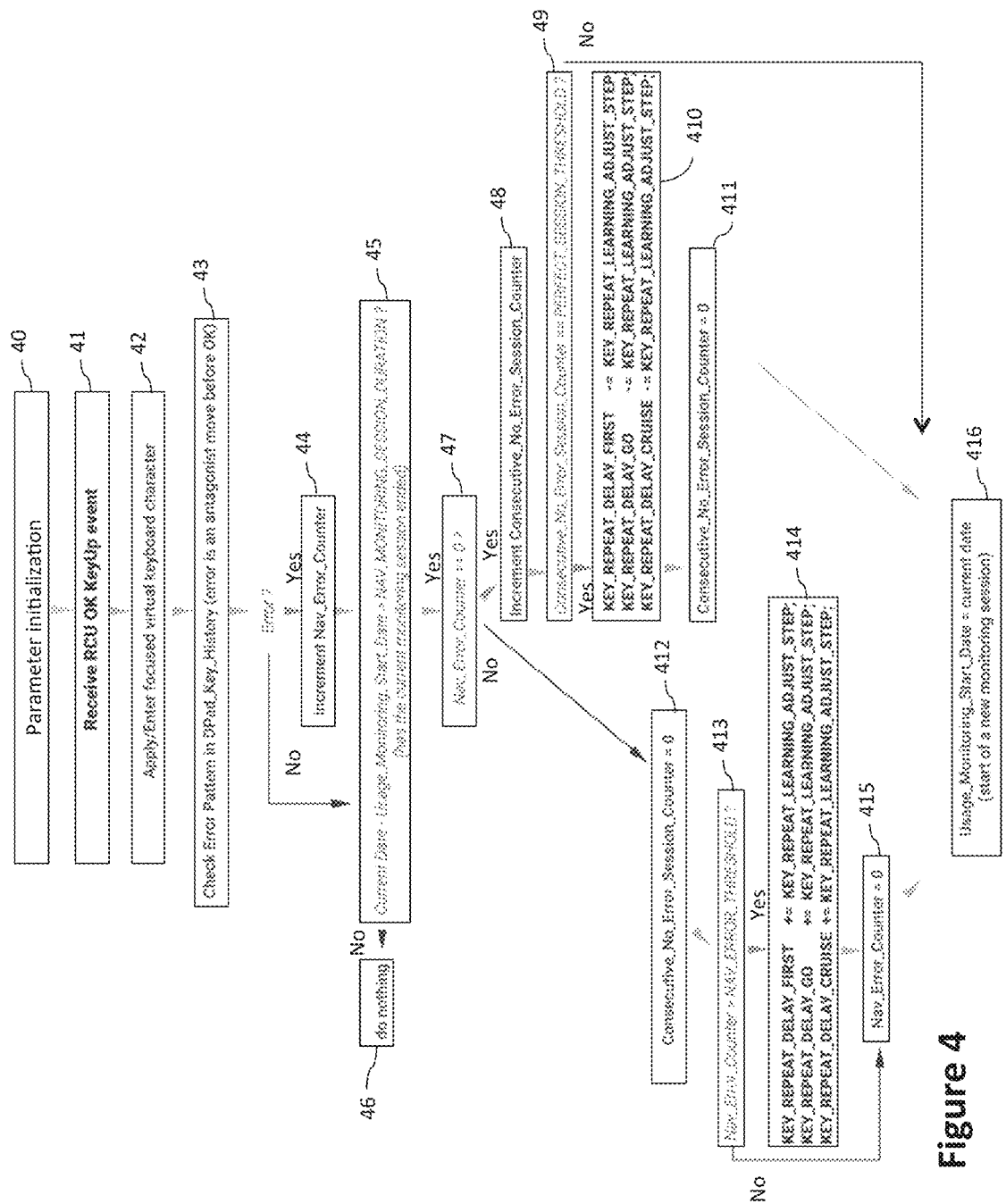
FIG. 4 is a flowchart of another exemplary algorithm executed by the on-screen grid control device of FIG. 1 or 2.

FIG. 4 is a flowchart of a second algorithm (also referred to as "user customized speed algorithm") carried out by the on-screen keyboard control device of FIG. 1 or 2.

The aim is to allow the on-screen keyboard control device 8 to learn from the user and adapt at least one of the four key-repeat time-intervals discussed above, namely:
KEY_REPEAT_DELAY_FIRST;
KEY_REPEAT_DELAY_GO (and therefore the first value V1 of the variable key-repeat rate);
KEY_REPEAT_DELAY_CRUISE (and therefore the second value V2 of the variable key-repeat rate) and
KEY_REPEAT_DELAY_BORDER (and therefore the third value V3 of the variable key-repeat rate).

In the following exemplary embodiment, a single algorithm allows the user to increase/decrease three delay times (KEY_REPEAT_DELAY_FIRST, KEY_REPEAT_DELAY_GO and KEY_REPEAT_DELAY_CRUISE) of the same adjust step named KEY_REPEAT_LEARNING_ADJUST_STEP (=5 ms for instance) at the same time.

In variants we can have:
a specific learning algorithm for each key-repeat delay, and/or
a different value of KEY_REPEAT_LEARNING_ADJUST_STEP for each key-repeat delay, and/or
a first step (INCREASING_ADJUST_STEP) for an increase of the key-repeat time-interval(s) being learned and a second step (DECREASING_ADJUST_STEP) for a decrease of the key-repeat time-interval(s) being learned, with the value of the second step being different from the value of the first step.

To decide when speeding up or down the key-repeat feature, the OSK control device 8 monitors antagonist (forward-backward) moves of the indicator 18 (also referred to as "position-fix patterns") to detect if speed is too high or too low, and therefore to decide if the key-repeat time-intervals being learned must be increased or decreased.

In a particular embodiment, an antagonist move is defined by a sequence of moves of the indicator executed before receiving an OK validation signal transmitted from the remote-control unit (RCU):
at least N jumps according to a first direction, with N≥2;
followed by M jump(s) according to a second direction opposite to said first direction, with M=1 or M=2.

For instance, with the aforesaid definition:
the sequence "right>right>right>right>left>OK" is an antagonist move (the keyboard indicator moved too fast, the user had to move the indicator backwards one or two moves before selecting a character with the OK key);
the sequence "up>right>left>OK" is not considered an antagonist move (the user may move unconsciously when looking for a character).

As perfect accuracy for indicator moves generally means a slow system. It's not the best solution. The system becomes spineless in term of user experience, but also it alters the performance: it is often quicker to move fast and fine-tune, than getting to the target slowly in one shot. So, the antagonist moves are analyzed according to the usage and duration thereof.

For instance, a number P (e.g., $2 \leq P \leq 4$, and in a particular embodiment: P=3) of antagonist moves (N, M) detected during a time duration D1 (e.g., $10 \text{ s} \leq D1 \leq 30 \text{ s}$, and in a particular embodiment: D1=one session of duration R seconds, with R=20 s) triggers the speed decrease (i.e. an increase of the key-repeat time-intervals being learned). In the same way, if the user makes no antagonist move (N, M) during a time duration D2 (e.g. $40 \text{ s} \leq D2 \leq 120 \text{ s}$, and in a particular embodiment: D2=K sessions of duration R seconds, with K=4 and R=20 s), it triggers the speed increase (i.e. a decrease of the key-repeat time-intervals being learned).

The different steps of the second algorithm shown in FIG. 4 (particular embodiment for speeding up the system) are described below. The aforesaid customizable system parameters R, P and K are named respectively:

NAV_MONITORING_SESSION_DURATION;
NAV_ERROR_THRESHOLD; and
PERFECT_SESSION_THRESHOLD.

In step 40, a parameter initialization is performed as follows:
Usage_Monitoring_Start_Date=current date
Nav_Error_Counter=0
Consecutive_No_Error_Session_Counter=0

Note: Usage_Monitoring_Start_Date is used as time and initialized when the on-screen keyboard is called/displayed.

In step 41, the OSK control device receives a signal indicating a release (KeyUp event) of the OK key 6 of the remote-control unit (RCU) 1.

In step 42, the OSK control device applies (i.e. enters) the character selected (focused) by the indicator 18 on the on-screen keyboard 17.

In step 43, the OSK control device checks the content of the history variable named "D-pad_Key_History" which stores the indicator movements (see step 33 of FIG. 3), in order to detect an error, i.e. an antagonist move (N, M) of the indicator 18 as defined above.

If an antagonist move is detected in step 43, the algorithm continues in step 44, in which the OSK control device increments by one the counter named "Nav_Error_Counter", which counts the number of antagonist move.

A step 45 is carried out after step 44, or directly after step 43 if no antagonist move is detected in this step 43. In step 45, the OSK control device checks if a current monitoring session has ended. This is the case is the following condition is satisfied:

Current Date−Usage_Monitoring_Start_Date>NAV_MONITORING_SESSION_DURATION

In the case of a negative answer in step 45, the algorithm goes to an end step 46 ("do nothing").

In the case of a positive answer in step 45, the algorithm goes to step 47 in which the OSK control device checks if "Nav_Error_Counter" is equal to zero.

In the case of a positive answer in step 47, the algorithm goes to step 48 in which the OSK control device increments by one the counter named "Consecutive_No_Error_Session_Counter", which counts the number of consecutive session without antagonist move.

Step 48 is followed by a step 49 in which the OSK control device checks if "Consecutive_No_Error_Session_Counter" is equal to "PERFECT_SESSION_THRESHOLD".

In the case of a positive answer in step 49, the algorithm goes to step 410 in which the OSK control device decreases one or more of the three delay times (KEY_REPEAT_DELAY_FIRST, KEY_REPEAT_DELAY_GO and KEY_REPEAT_DELAY_CRUISE) of the adjust step KEY_REPEAT_LEARNING_ADJUST_STEP. Then it goes to step 411, in which "Consecutive_No_Error_Session_Counter" is reset to zero, and then to a final step 416 in which the OSK control device resets "Usage_Monitoring_Start_Date" to the current date (thus starting a new monitoring session).

In the case of a negative answer in step 49, the algorithm goes directly to the final step 416.

In the case of a negative answer in step 47, the algorithm goes to step 412, in which the OSK control device resets "Consecutive_No_Error_Session_Counter" to zero, and then to step 413 in which the OSK control device checks if "Nav_Error_Counter" is equal to NAV_ERROR_THRESHOLD.

In the case of a positive answer in step 413, the algorithm goes to step 414 in which the OSK control device increases three delays (KEY_REPEAT_DELAY_FIRST, KEY_REPEAT_DELAY_GO and KEY_REPEAT_DELAY_CRUISE) of the adjust step KEY_REPEAT_LEARNING_ADJUST_STEP. Then it goes to a step 415, in which "Nav_Error_Counter" is reset to zero, and then to the final step 416.

In the case of a negative answer in step 413, the algorithm goes directly to step 415.

The present description illustrates the principles of the present disclosure. It will thus be appreciated that those skilled in the art will be able to devise various arrangements that, although not explicitly described or shown herein, embody the principles of the disclosure and are included within its scope.

All examples and conditional language recited herein are intended for educational purposes to aid the reader in understanding the principles of the disclosure and the concepts contributed by the inventors to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the diagrams presented herein represent conceptual views of illustrative circuitry embodying the principles of the disclosure. Similarly, it will be appreciated that any flow charts, flow diagrams, state transition diagrams, pseudocode and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, read only memory (ROM) for storing software, random access memory (RAM), and nonvolatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

In the claims, hereof, any element expressed as a means for performing a specified function is intended to encompass any way of performing that function including, for example, a) a combination of circuit elements that performs that function or b) software in any form, including, therefore, firmware, microcode or the like, combined with appropriate circuitry for executing that software to perform the function. The disclosure as defined by such claims resides in the fact that the functionalities provided by the various recited means are combined and brought together in the manner which the claims call for. It is thus regarded that any means that can provide those functionalities are equivalent to those shown herein.

The invention claimed is:

1. A method, comprising:
   receiving at a display device a series of signals transmitted from a remote-control unit, wherein the series of signals are generated by successive activations of keys on the remote-control unit;
   analyzing a time for moving an indicator successive positions on a grid depicted on the display device based on the series of signals received from the remote-control unit; and
   modifying said time and moving the indicator successive positions based on said modified time.

2. The method according to claim 1, wherein the grid comprises at least one row and a plurality of columns or a plurality of rows and at least one column.

3. The method according to claim 1, wherein the time for moving the indicator successive positions is based on the inverse of the time interval for moving the indicator between consecutive positions on the grid.

4. The method according to claim 3, wherein
   the time for moving the indicator successive positions is a first time, if a number of indicator moves is lower or equal to a first number of indicator moves; and
   the time for moving the indicator successive positions is a second time, less than the first time, if the number of indicator moves is greater than the first number of indicator moves.

5. The method according to claim 1, wherein the time is analyzed when the indicator is moved at least N successive positions in a first direction, with $N \geq 2$, followed by M successive positions in a second direction opposite to said first direction, with M=1 or M=2.

6. The method according to claim 5, wherein the time is modified if at least two antagonist moves, P>2, are performed during a time period, D1, wherein said antagonist move comprises at least N successive positions in the first direction, with $N \geq 2$, followed by M successive positions in the second direction opposite to said first direction, with M=1 or M=2.

7. The method according to claim 6, wherein if $2 \leq P \leq 4$, and $10 \text{ s} \leq D1 \leq 30 \text{ s}$, the time for moving the indicator successive positions on the grid is decreased.

8. The method according to claim 6, wherein if P=0, and $40 \text{ s} \leq D1 \leq 120 \text{ s}$, the time for moving the indicator successive positions on the grid is increased.

9. The method according to claim 1, wherein said grid is one of:
   an on-screen keyboard;
   an on-screen menu; and
   an on-screen list.

10. A device, comprising:
    a receiver, configured to receive a series of signals transmitted from a remote-control unit, wherein the series of signals are generated by successive activations of keys on the remote-control unit; and
    a processor, configured to:
      analyze a time for moving an indicator successive positions on a grid depicted on a display device based on the series of signals received from the remote-control unit; and
      modify said time and moving the indicator successive positions based on said modified time.

11. The device according to claim 10, wherein the grid comprises at least one row and a plurality of columns or a plurality of rows and at least one column.

12. The device according to claim 11, wherein the time for moving the indicator successive positions is based on the inverse of the time interval for moving the indicator between consecutive positions on the grid.

13. The device according to claim 12, wherein
    the time for moving the indicator successive positions is a first time, if a number of indicator moves is lower or equal to a first number of indicator moves; and
    the time for moving the indicator successive positions is a second time, less than the first time, if the number of indicator moves is greater than the first number of indicator moves.

14. The device according to claim 10, wherein the time is analyzed when the indicator is moved at least N successive positions in a first direction, with $N \geq 2$, followed by M successive positions in a second direction opposite to said first direction, with M=1 or M=2.

15. The device according to claim 14, wherein the time is modified if at least two antagonist moves, P>2, are performed during a time period, D1, wherein said antagonist move comprises at least N successive positions in the first direction, with $N \geq 2$, followed by M successive positions in the second direction opposite to said first direction, with M=1 or M=2.

16. The device according to claim 15, wherein if $2 \leq P \leq 4$, and $10 \text{ s} \leq D1 \leq 30 \text{ s}$, the time for moving the indicator successive positions on the grid is decreased.

17. The device according to claim 15, wherein if P=0, and $40 \text{ s} \leq D1 \leq 120 \text{ s}$, the time for moving the indicator successive positions on the grid is increased.

18. The device according to claim 10, wherein said grid is one of:
    an on-screen keyboard;
    an on-screen menu; and
    an on-screen list.

19. A system, comprising:
    a remote-control unit; and
    a device according to claim 10.

20. A non-transitory computer-readable medium containing a program comprising a sequence of instructions for implementing a method according to claim 1, when executed.

* * * * *